(12) United States Patent
Demone

(10) Patent No.: US 8,754,687 B2
(45) Date of Patent: Jun. 17, 2014

(54) FREQUENCY-DOUBLING DELAY LOCKED LOOP

(71) Applicant: MOSAID Technologies Incorporated, Ottawa (CA)

(72) Inventor: Paul W. Demone, Kanata (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

(21) Appl. No.: 14/023,047

(22) Filed: Sep. 10, 2013

(65) Prior Publication Data

US 2014/0009196 A1    Jan. 9, 2014

Related U.S. Application Data

(63) Continuation of application No. 13/607,015, filed on Sep. 7, 2012, now Pat. No. 8,558,593, which is a continuation of application No. 12/784,157, filed on May 20, 2010, now Pat. No. 8,283,959, which is a continuation of application No. 12/284,763, filed on Sep. 25, 2008, now Pat. No. 7,746,136, which is a continuation of application No. 11/495,212, filed on Jul. 28, 2006, now Pat. No. 7,456,666, which is a continuation of application No. 10/227,547, filed on Aug. 26, 2002, now Pat. No. 7,116,141, which is a continuation of application No. 09/562,024, filed on May 1, 2000, now Pat. No. 6,441,659.

(30) Foreign Application Priority Data

Apr. 30, 1999  (CA) .................................... 2270516

(51) Int. Cl.
*H03L 7/06*    (2006.01)

(52) U.S. Cl.
USPC .......................................................... 327/158

(58) Field of Classification Search
None
See application file for complete search history.

(56) References Cited

U.S. PATENT DOCUMENTS

| 4,694,197 A | 9/1987 | Sprague |
| 4,713,621 A | 12/1987 | Nakamura et al. |
| 4,922,141 A | 5/1990 | Lofgren et al. |
| 5,059,924 A | 10/1991 | JenningsCheck |
| 5,077,529 A | 12/1991 | Ghoshal et al. |

(Continued)

FOREIGN PATENT DOCUMENTS

| DE | 19753473 A1 | 8/1998 |
| EP | 0441684 B1 | 8/1991 |

(Continued)

OTHER PUBLICATIONS

Gilingham, P., et al., "SLDRAM: High-Performance, Open-Standard Memory," IEEE Micro, Nov./Dec. 1997, pp. 29-39.

(Continued)

*Primary Examiner* — Lincoln Donovan
*Assistant Examiner* — Khareem E Almo
(74) *Attorney, Agent, or Firm* — Conley Rose, P.C.; J. Robert Brown, Jr.

(57) ABSTRACT

A frequency multiplier circuit comprising a delay line receiving at one end thereof a reference clock for generating clock tap outputs from respective ones of a plurality of period matched delay elements; a clock combining circuit responsive to pairs of tap outputs for generating a rising and falling edge of an output clock pulse from respective ones of the pairs whereby the output clock period is less than the input clock period.

15 Claims, 8 Drawing Sheets

(56) References Cited

U.S. PATENT DOCUMENTS

| | | | |
|---|---|---|---|
| 5,336,939 | A | 8/1994 | Eitrhem et al. |
| 5,345,186 | A | 9/1994 | Lesmeister |
| 5,412,349 | A | 5/1995 | Young et al. |
| 5,463,337 | A | 10/1995 | Leonowich |
| 5,563,554 | A | 10/1996 | Mizuno |
| 5,614,841 | A | 3/1997 | Marbot et al. |
| 5,614,855 | A | 3/1997 | Lee et al. |
| 5,634,117 | A | 5/1997 | Conary et al. |
| 5,777,501 | A | 7/1998 | AbouSeido |
| 5,796,673 | A | 8/1998 | Foss et al. |
| 5,815,016 | A | 9/1998 | Erickson |
| 6,150,855 | A | 11/2000 | Marbot |
| 6,295,328 | B1 | 9/2001 | Kim et al. |
| 6,441,659 | B1 | 8/2002 | Demone |
| 6,667,641 | B1 | 12/2003 | Wang et al. |
| 7,116,141 | B2 | 10/2006 | Demone |
| 7,456,666 | B2 | 11/2008 | Demone |
| 7,746,136 | B2 | 6/2010 | Demone |
| 8,085,074 | B1 | 12/2011 | Janardhanan et al. |
| 8,283,959 | B2 | 10/2012 | Demone |

FOREIGN PATENT DOCUMENTS

| | | |
|---|---|---|
| EP | 0570158 A2 | 5/1993 |
| EP | 0800275 A1 | 10/1997 |
| EP | 0800276 A1 | 10/1997 |
| JP | 63-211919 | 9/1988 |
| JP | 06-202756 | 7/1994 |
| JP | 08-056143 | 2/1996 |

OTHER PUBLICATIONS

Nakase, Y., et al. "Source-Synchronous and Timing Vernier Techniques for 1.2GB/s SLDRAM Interface," ISSCC Dig. Tech. Papers, Feb. 1998, 18 pages.

Nakase, Y., et al. "Source-Synchronous and Timing Vernier Techniques for 1.2GB/s SLDRAM Interface," IEEE Journal of Solid State Circuits, vol. 34, No. 4, Apr. 1999, pp. 494-500.

Paris, L., et al., "A 800MB/s 72Mb SLDRAM with Digitally-Calibrated DLL," IEEE International Solid-State Circuits Conference, ISSCC99, Session 24, Paper WP 24.3., 1999, 3 pages.

Sidiropoulos, S., etal., "A Semidigital Dual Delay-Locked Loop," IEEE Journal od Solid State Circuits, XP-000752878, Nov. 1997, pp. 1683-1692.

Wu, J., et al. "An SDRAM Interaface for Simplified "At-Speed" Testing of SLDRAM Internal Array," 1998 IEEE, pp. 38-44.

Young, I., et al. "A PLL Clock Generator with 5 to 110 MHz of Lock Range for Microprocessors," IEEE Journal of Solid-State Circuits, vol. 27, No. 11, Nov. 1992, pp. 1599-1607.

Foreign Communication From A Counterpart Application, PCT Application No. PCT/CA00/00468, International Search Report dated Sep. 6, 2000, 8 pages.

Office Action dated Mar. 28, 2001, 9 pages, U.S. Appl. No. 09/562,024, filed May 1, 2000.

Office Action dated Dec. 6, 2001, 8 pages, U.S. Appl. No. 09/562,024, filed May 1, 2000.

Notice of Allowance dated Mar. 25, 2002, 5 pages. U.S. Appl. No. 09/562,024, filed May 1, 2000.

Notice of Allowance dated Mar. 28, 2002, 8 pages, U.S. Appl. No. 09/562,024, filed May 1, 2000.

Office Action dated Mar. 12, 2003, 7 pages, U.S. Appl. No. 10/227,547, filed Aug. 26, 2002.

Office Action dated Apr. 11, 2005, 9 pages, U.S. Appl. No. 10/227,547, filed Aug. 26, 2002.

Office Action dated Nov. 18, 2005, 8 pages, U.S. Appl. No. 10/227,547, filed Aug. 26, 2002.

Notice of Allowance dated Sep. 8, 2003, 7 pages, U.S. Appl. No. 10/227,547, filed Aug. 26, 2002.

Notice of Allowance dated Dec. 16, 2003, 6 pages, U.S. Appl. No. 10/227,547, filed Aug. 26, 2002.

Notice of Allowance dated Apr. 12, 2006, 7 pages, U.S. Appl. No. 10/227,547, filed Aug. 26, 2002.

Office Action dated Jun. 15, 2007, 10 pages, U.S. Appl. No. 11/495,212, filed Jul. 28, 2006.

Office Action dated Feb. 11, 2008, 9 pages, U.S. Appl. No. 11/495,212, filed Jul. 28, 2006.

Notice of Allowance dated Jul. 10, 2008, 6 pages, U.S. Appl. No. 11/495,212, filed Jul. 28, 2006.

Office Action dated Jul. 14, 2009, 10 pages, U.S. Appl. No. 12/284,763, filed Sep. 25, 2008.

Notice of Allowance dated Feb. 22, 2010, 8 pages, U.S. Appl. No. 12/284,763, filed Sep. 25, 2008.

Office Action dated Jul. 30, 2010, 10 pages, U.S. Appl. No. 12/784,157, filed May 20, 2010.

Office Action dated Jan. 10, 2011, 8 pages, U.S. Appl. No. 12/784,157, filed May 20, 2010.

Advisory Action dated Apr. 5, 2011, 3 pages U.S. Appl. No. 12/784,157, filed May 20, 2010.

Office Action dated May 6, 2011, 6 pages, U.S. Appl. No. 12/784,157, filed May 20, 2010.

Office Action dated Nov. 9, 2011, 7 pages, U.S. Appl. No. 12/784,157, filed May 20, 2010.

Advisory Action dated Feb. 16, 2012, 3 pages, U.S. Appl. No. 12/784,157, filed May 20, 2010.

Notice of Allowance dated Jun. 7, 2012, 7 pages U.S. Appl. No. 12/784,157, filed May 20, 2010.

Notice of Allowance dated Jun. 10, 2013, 13 pages U.S. Appl. No. 13/607,015, filed Sep. 7, 2012.

);

FREQUENCY-DOUBLING DELAY LOCKED LOOP

RELATED APPLICATIONS

This application is a continuation of U.S. application Ser. No. 13/607,015, filed Sep. 7, 2012, which is a continuation of U.S. application Ser. No. 12/784,157, filed May 20, 2010, issued as U.S. Pat. No. 8,283,959 on Oct. 9, 2012, which is a continuation of U.S. application Ser. No. 12/284,763, filed Sep. 25, 2008, issued as U.S. Pat. No. 7,746,136 on Jun. 29, 2010, which is a continuation of U.S. application Ser. No. 11/495,212, filed Jul. 28, 2006, issued as U.S. Pat. No. 7,456,666 on Nov. 25, 2008, which is a continuation of U.S. application Ser. No. 10/227,547, filed Aug. 26, 2002, issued as U.S. Pat. No. 7,116,141 on Oct. 3, 2006, which is a continuation of U.S. application Ser. No. 09/562,024, filed May 1, 2000, issued as U.S. Pat. No. 6,441,659 on Aug. 27, 2002, which claims priority under 35 U.S.C. §119 or 365 to Canadian Application No. 2,270,516, filed Apr. 30, 1999.

The entire teachings of the above application(s) are incorporated herein by reference.

FIELD OF THE INVENTION

This invention relates to the field of clock generation circuit for generating a high speed clock from a reference clock signal, and more particularly, to such circuits incorporating a delay locked loop (DLL).

BACKGROUND OF THE INVENTION

In many relatively self-contained electronic subsystems such as integrated circuits and multi-chip modules, an internal clock is used to synchronize operations. Often the frequency of the internal clock is higher than the frequency of an external interface clock which is used to synchronize the transfer data and control information to and from the subsystem. It is often necessary to establish a defined phase and frequency relationship between the internal clock and the slower external interface clock for efficient low latency operation of the interface. As an example, a common requirement is to have the internal clock signal be exactly twice the frequency of the interface clock. Even tighter restrictions might require that rising edges of the interface clock line up with every second rising edge of the internal clock.

When the interface clock is generated outside the subsystem, it is necessary to synthesize the higher-frequency internal clock signal within the subsystem, while simultaneously meeting the desired phase and frequency relationship. It may also be necessary for the internal clock to track variations in phase and/or frequency of the interface clock.

The synthesis of an appropriate internal clock based on a slower interface clock is often accomplished by using a phase-locked loop or PLL circuit within the subsystem. Many PLL implementations have been presented in the field. Generally, in a PLL scheme, the external interface clock provides the reference clock input to the PLL which generates the internal clock signal. An appropriately divided down version of the internal clock signal (or a delayed version thereof) serves as the local feedback to the PLL. A representative example of such a scheme is disclosed in U.S. Pat. No. 5,412,349 to Young et al and the accompanying paper "A PLL Clock Generator with 5 to 110 MHz Range for Microprocessors," IEEE JSSC Vol. 27. No. 11, November 1992. pg. 1599-1606. The PLL based clock generator described therein includes a phase frequency detector, charge pump, loop filter, and a voltage controlled oscillator (VCO), from which an internal clock having a 50% duty cycle is generated. The VCO operates at twice the external clock frequency and a divide-by-2 circuit is used to accurately generate the 50% duty cycle internal clock which is used internally within the microprocessor. Another example of a PLL clock generation scheme is presented in U.S. Pat. No. 5,634,117 to Conary et al. In this reference, a microprocessor is described which operates at the speed of the system bus or at a speed which is a multiple of the bus speed on a selectable basis. Specifically, the microprocessor core operates at the same or twice the frequency of the address/data buses by employing a PLL which generates clock signals for controlling operations within the microprocessor.

In both of the above mentioned references, the external interface clock is a continuous free-running clock, usually generated with a crystal oscillator somewhere on the subsystem and routed to the microprocessor, memory and other elements. Then, a PLL-based clock generation system is used to generate the internal clocks. However, PLL-based clock generation systems are generally unsuitable if the interface clock is intermittent (i.e. not continuous) and if it is necessary to restore the desired phase and frequency relationship between the interface clock and internal clock quickly when the interface clock reappears. In addition, PLLs are also unsuitable if it is necessary for the internal clock to accurately track high frequency phase jitter in the interface reference clock.

More generally, analog PLLs suffer from a number of general drawbacks in today's mainly digital memory design environment. Firstly, PLLs employ analog elements which typically consume substantially more power than digital elements due to their dc bias current requirements. Secondly, recent trends towards decreasing power supply voltages for reducing power consumption in high density memory applications runs against the need for relatively high power supply voltage for the analog elements of PLLs. Thirdly, the length of time required to achieve a locked condition for PLLs is relatively large due to the need for a large closed loop time constant to minimize jitter. In general, in digital systems such as memories, microprocessors and ASICs, these types of PLLs introduce unnecessary analog design complications in a mainly digital design and therefore have recently been avoided.

An alternate approach to clock data synchronization can be achieved through the use of a Delay Locked Loop (DLL). Conventional DLL circuits have been in the industry as a digital alternative to analog PLLs. These circuits typically consist of a tapped digital delay line made up of digital delay elements. The taped outputs are input into some multiplexing circuitry which is used to select the appropriate phase delay of the input clock to provide to the internal circuitry. The internal clock is also fedback to a phase detector, similar in function to phase detectors in PLLs. An example of this structure is disclosed in MOSAID Technologies Inc. U.S. Pat. No. 5,796,673 to Foss et al. An alternate DLL configuration is described in another MOSAID Technologies Inc. U.S. Pat. No. 5,777,501 to Abousiedo. This structure uses a folded delay line implementation in which the delay line is folded at approximately half its total delay length, and shunting connections are provided between the portion of the delay line going one way and the portion returning the other way. The shunting connections are controlled by a shift register which selects the correct tap position for providing the desired clock for internal distribution.

Most recently, high speed memory interface circuits have furthered the improvement of DLL-based internal clock generating schemes. Specifically, a high bandwidth memory interface application employing a differential charge pump and a phase shifter is presented in U.S. Pat. No. 5,614,855 to Lee. et al. This approach, although fairly robust, is however an analog solution, employing a number of complex analog elements such as the differential charge pump, the duty cycle correction amplifiers, and the phase mixer, and as a result, suffers from the same general drawbacks of implementing analog circuits in the digital domain as were mentioned above. An improved digital implementation of a DLL for use in high bandwidth memory interface circuitry is presented by Gillingham et al. in "A 800 Mbyte/sec 72 Mbit SLDRAM with Digitally Calibrated DLL." ISSCC February 1999.

In this circuit, the delay locked loop locks to within 5 ns of the reference clock and provides 32 equally spaced outputs. Using a simple DLL with fixed delay elements results in jitter during operation as temperature or voltage variations cause the DLL to jump from one delay element to another. This problem is overcome by controlling the delay of each unit delay stage so that 32 stages always produce a 5 ns delay. A seven bit current output DAC shown in FIG. 1 of the Gillingham reference, provides the reference current for the delay stages. The DAC has a non-linear transfer function to provide cost and delay resolution over process, temperature, and voltage variation. The operational circuit may be explained as follows: during initialization, a single tap from the 32 stage delay line which matches the reference clock is selected. This may be termed the virtual zero degrees tap. Normally, a few stages may be used as a lead in delay to compensate for delay in input buffers and clock distribution. On initialization, the current control for this lead in delay is set to mid range so that during operation as temperature or voltage fluctuations occur, the lead in delay is adjusted to maintain the virtual zero degrees tap in phase with the reference clock. Thus, the 32 stage delay line, which is phased to one fill period of the reference clock, remains in constant phase relative to the external clock.

In general, most DLL-based internal clock generating schemes can accurately track phase jitter and can recover phase quickly but are restricted to generating an internal clock frequency which is the same as the interface clock frequency.

SUMMARY OF THE INVENTION

In a first aspect of the invention a frequency multiplier circuit for generating an output clock signal in response to a reference input clock signal has a delay line for receiving and delaying the reference input clock signal. The delay line has a plurality of serially coupled delay stages each having a delay stage tap output. A plurality of combining circuit cells are provided, each cell having inputs respectively coupled to ones of a predetermined number of the delay stage tap outputs. Each cell proves at least one combining cell output signal having a multiplied frequency of the reference input clock signal. The combining cell output signals from the plurality of combining circuit cells are spaced in phase. A selector is coupled to the combining cell outputs for selecting one of the combining cell output signals for producing the output clock signal.

In another aspect of the invention a method for generating an output clock signal in response to a reference input clock signal is provided. A plurality of output signals are generated. The signals are spaced in phase, each output signal having a multiplied frequency of the reference input clock signal. The output clock signal is selected from one of the plurality of output signals having a phase closest to the reference input clock signal phase.

There are two variants of the Invention. The first is referred as the Frequency Doubling DLL Without Duty Cycle Correction while the second is the Frequency Doubling DLL With Duty Cycle Correction. The two variants differ in specific implementation of the TOG cells and how these cells connect to the N-stage period matched DLL.

BRIEF DESCRIPTION OF THE DRAWINGS

These and other features of the preferred embodiments of the invention will become more apparent in the following detailed description in which reference is made to the appended drawings wherein: The drawings are not necessarily to scale, emphasis instead being placed upon illustrating embodiments of the present invention.

DETAILED DESCRIPTION OF A PREFERRED EMBODIMENT

Figure 1A:
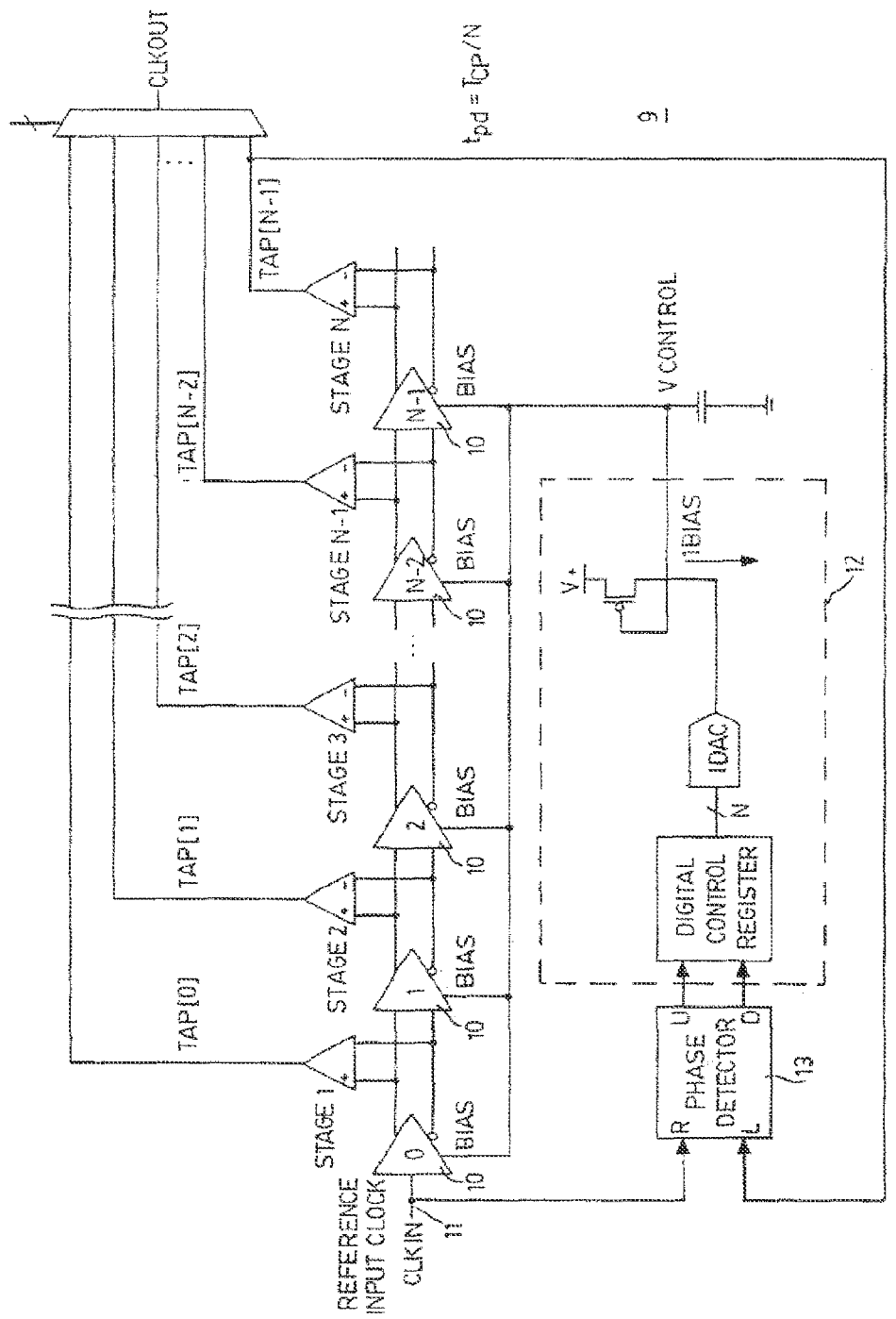
FIG. 1(a) is a schematic block diagram of a conventional DLL using digitally-encoded control circuitry to control the delay through the delay line stages according to the prior art.
Figure 1B:
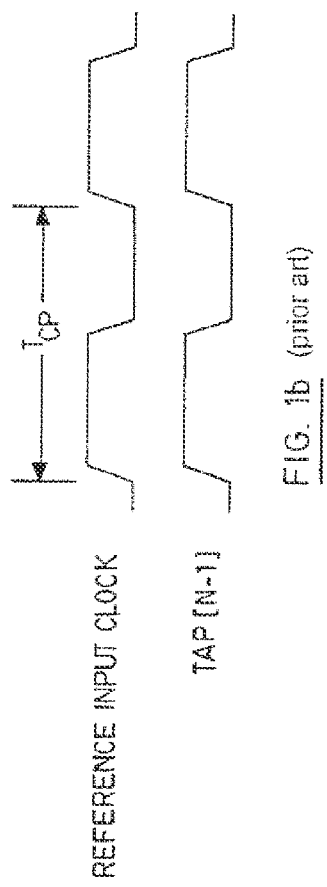
FIG. 1(b) is a timing diagram illustrating the clock periods of the reference input clock and the (N–1)th tap output of the DLL shown in FIG. 1(a)

With reference to FIG. 1(a), a conventional delay locked loop (DLL) as discussed in the aforementioned paper entitled "A 800 Mbyte/sec 72 Mbit SLDRAM with Digitally Calibrated DLL," is illustrated, consisting of an N-stage period-matched DLL 9, i.e. each of the 0–N tap position outputs represents a TCP/N portion of TCP, where TCP is the reference input clock period. This DLL is based on N identical delay stages 10 connected serially, with the final delay stage output TAP[N–1] being input into a phase detector 13 which compares this final delay stage output with the reference input clock 11. The phase detector 13 outputs two control signals LEAD (U) and LAG (D), indicative of whether the TAP[N–1] output leads or lags the reference input clock 11, and uses them as inputs into a delay control block 12. The propagation delay through each delay element is adjustable using control signals generated by the delay control block 12 based on an analog quantity such as current or voltage, or alternatively, using a digitally encoded value. Such current or voltage analog techniques are well known. The delay of all N stages is identically set by the delay control block in conjunction with a phase detector such that the phase difference between the rising edge of the output from the final delay stage TAP[N–1] and the reference input clock feeding the first stage is as small as possible. When a quiescent state is reached after initial DLL lock acquisition (not shown but well known in the art), the propagation delay through each of the N delay stages, tPD[stage] is very close to TCP/N. As a result of the delay control block and phase detector action, the delay between the TAP[N−1] output and the TAP[0] output is approximately the same as the clock period of the input reference clock, as illustrated in FIG. 1(b).

Figures 2A, 2B:
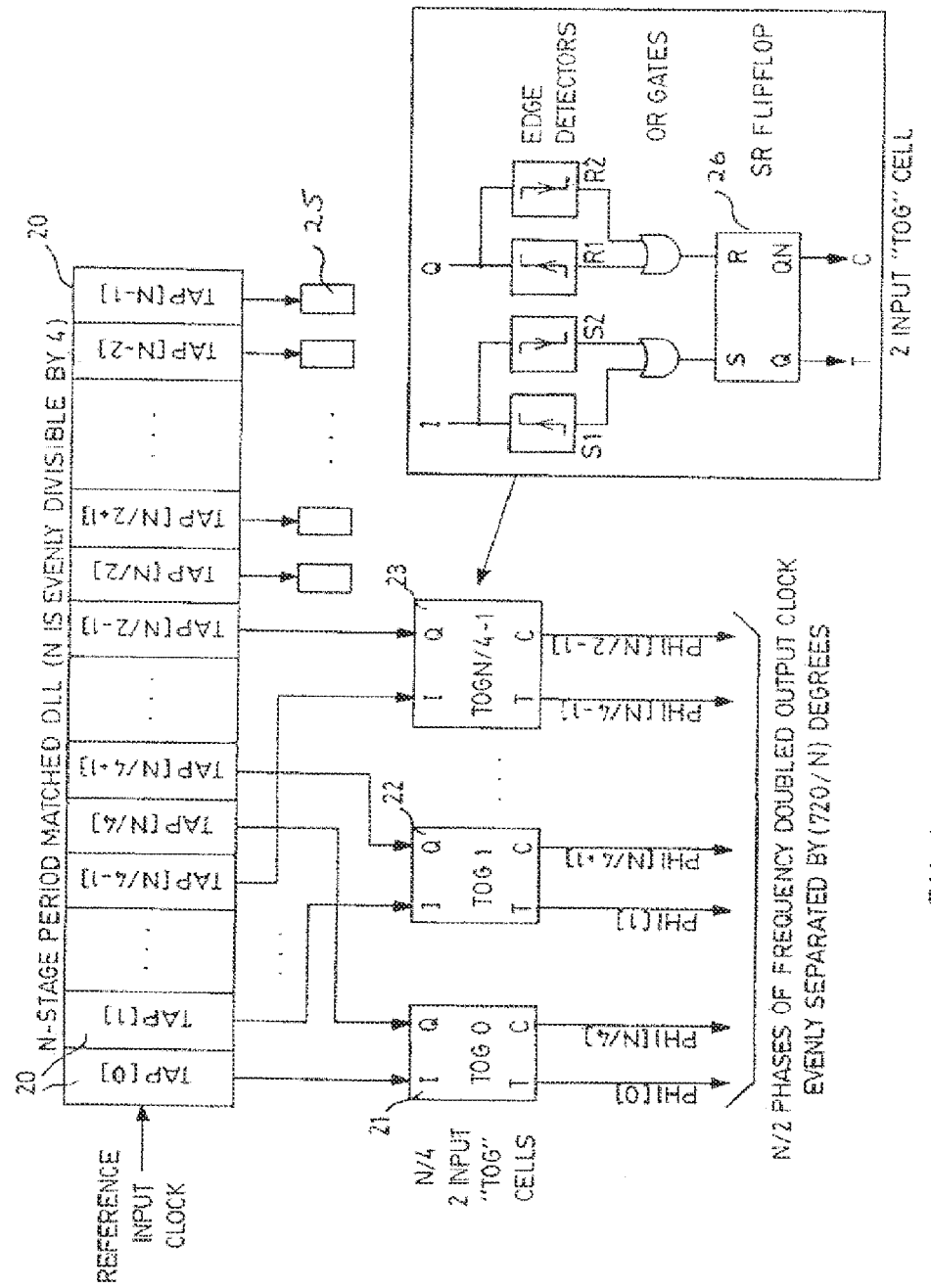
FIG. 2(a) is a block diagram of a first embodiment of the invention.
FIG. 2(b) is a diagram of one of the 2-input cells used in the embodiment of FIG. 2(a)

A frequency-doubling DLL according to a first embodiment of the invention is illustrated in FIG. 2(a). An N-stage period-matched DLL (with N being divisible by 4) is used to provide (N−1) outputs TAP[N−1], where each delay stage 20 provides one TAP[i] output. The first N/2 delay stages outputs are connected to N/4 2-input tap output generator or "TOG" cells as shown in FIG. 2(a). Dummy loads 25 are coupled on upper N/2 outputs to keep TPD uniform.

More specifically, the I (in-phase or 0 degree) and Q (quadrature or 90 degree) inputs to the 2-input TOG cell are connected to delay elements N/4 stages apart. For example, if N=32, the TOG cell 21 would receive inputs TAP[0] and TAP[8], TOG cell 22 would receive inputs TAP[1] and TAP[9] and so forth up to TOG cell 23 which would receive inputs TAP[7] and TAP[15]. Two outputs, true (T) and complimentary (C), are generated by each TOG cell; for example following the element numbering from above, outputs PHI[0] and PHI[N/4] for TOG cell 21, outputs PHI[1] and PHI[N/4+1] for TOG cell 22, and so forth up to an including outputs PHI[N/4−1] and PHI[N/2−1] for TOG cell 23. The PHI[i] outputs of the N/4 TOG cells represent N/2 distinct phases, spaced 360/(N/2) degrees apart, of an internally generated clock signal whose frequency is twice that of the reference input clock. These phase outputs are used to provide the desired internally generated clock to the internal circuitry as will be described in further detail below.

FIG. 2(b) illustrates one of the two input TOG cells 23 used in FIG. 2(a). The TOG cell consists of an SR flip-flop 26 with complimentary outputs that is set on rising and falling edges of I (the in-phase output) and reset on the rising and falling edges of Q (the quadrature output) as shown in the timing diagram of FIG. 3.

Figure 3:
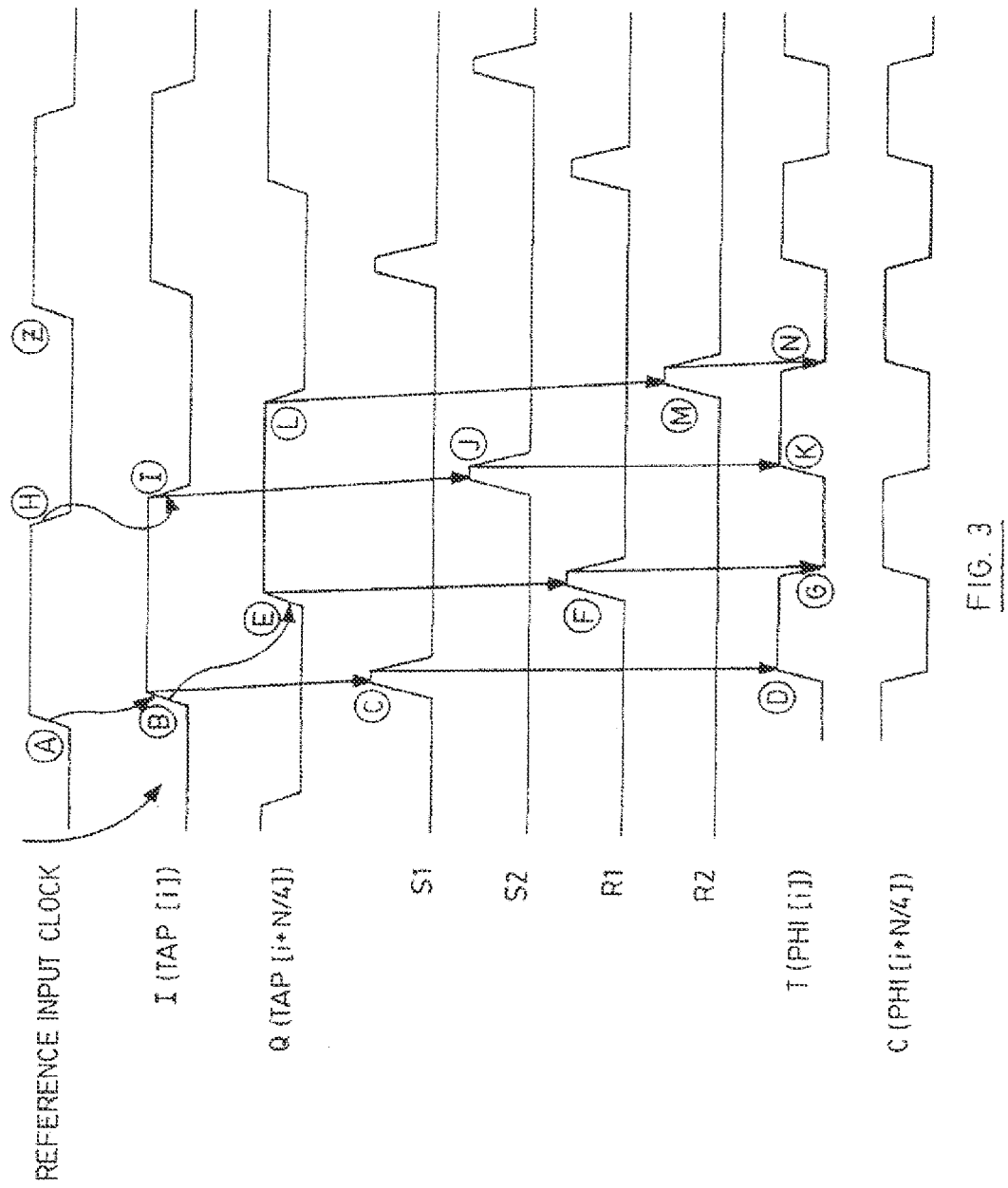
FIG. 3 is a timing diagram illustrating the operation of the embodiment of FIG. 2(a)

The operation of the embodiment illustrated in FIG. 2(a) and FIG. 2(b) will now be described with reference to FIG. 3. In response to a DLL-enable signal (not shown), on a rising edge of the reference input clock, clock edge A, the generation of the frequency-doubled output clock is initiated. The I (in-phase or 0 degree) tap position for tap i rises on clock edge B, in response to the rising edge A. Within the TOG cell associated with TAP[i], the I input generates a set signal S1 for setting the SR flip-flop in the TOG cell; this occurs on rising edge C. The T output of the TOG cell outputs a clock signal PHI[i] beginning with rising edge D, which has double the frequency of the reference input clock. The C output of the same associated TOG cell outputs the logical complement of the T output PHI[i+N/4], having the same frequency as PHI[i].

Also initiated from rising edge B is the Q output TAP[i+N/4], since this output is derived after the reference clock has passed through delays TAP[i] through TAP[i+N/4]. A similar sequence as described above for rising edges B-C-D ensues for rising edges E-F-G, triggered by rising edge B. As can be seen, both the sequences B-C-D and E-F-G have internally fixed delays based on the fixed number of delay elements in the path (excluding variations in temperature and process between delay elements), and both paths are initiated by the rising edge A of the reference input clock. Therefore, once clock edge A has risen, the two sequences B-C-D and E-F-G propagate independently.

Subsequently, on the falling edge of the reference input clock, edge H, a similar sequence is set in motion. Falling edge H triggers falling edges I-J-K as well as L-M-N. It is important to note that once again, as in the case with the rising edge A, once the falling edge of the reference input clock H has occurred, the sequences I-J-K and L-M-N propagate independently. If however, the duty cycle of the reference input clock is not 50%, i.e. the duration between rising edge A and falling edge H is not equal to the delay between falling edge H and subsequent rising edge Z, then the associated sequences will be skewed and the resulting output clocks T and C will not have a 50% duty cycle either. For example, if the duration between A and H is larger than between H and Z, there will be a corresponding expanded delay between the rising edge D and the falling edge G of output clock T, and there will be a contracted delay between rising edge K and falling edge N. The implementation described above is therefore considered to be without duty cycle correction because any variation in the input clock duty cycle above or below 50% will cause non-uniformity in the frequency doubled output clock period between even and odd pulses and between odd and even pulses.

Figures 4A, 4B:
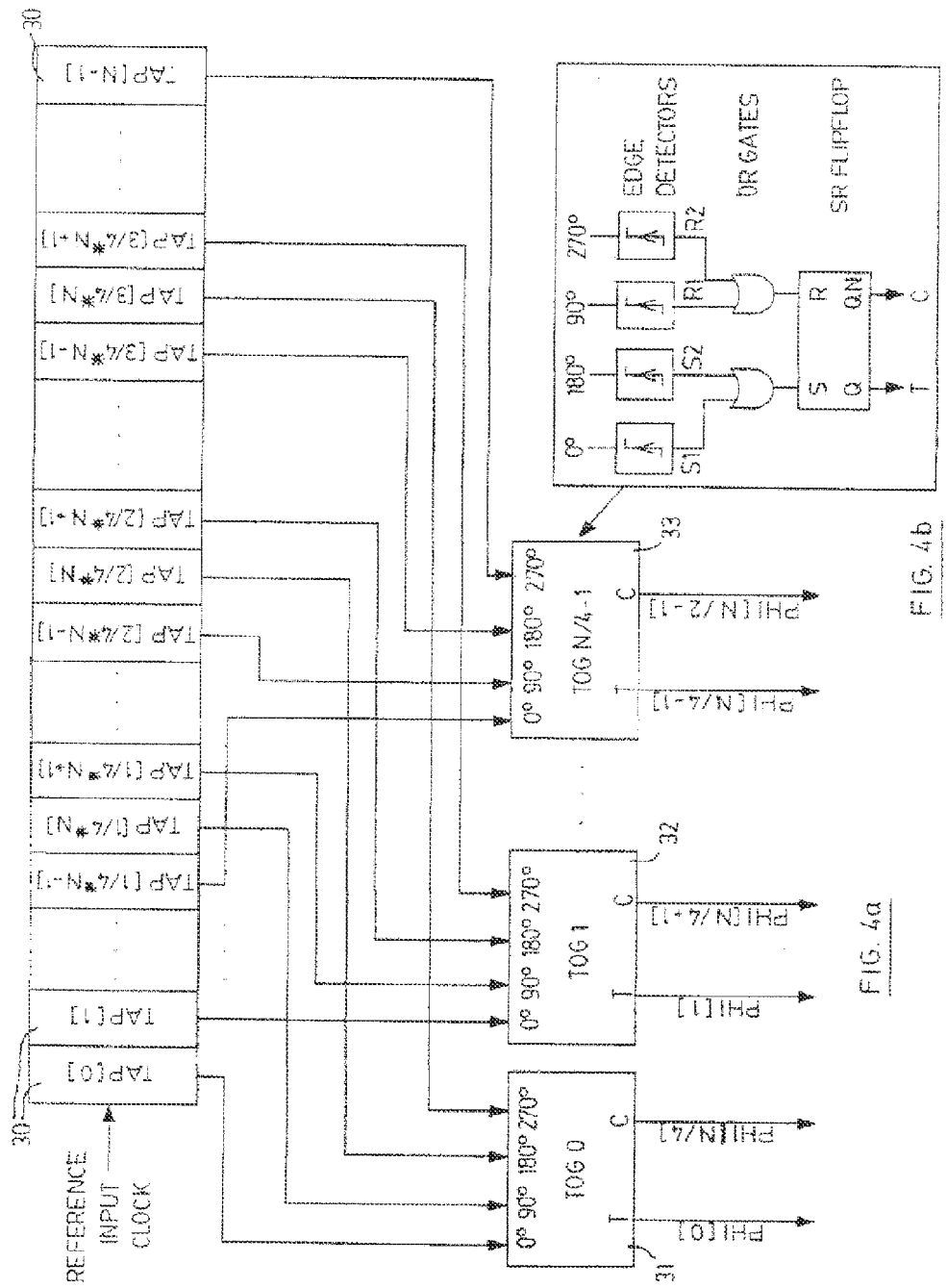
FIG. 4(a) is a block diagram of a second embodiment of the invention.
FIG. 4(b) is a diagram of one of the 4-input cells used in the embodiment of FIG. 4(a)

FIG. 4(a) illustrates an alternate embodiment of the frequency doubling DLL invention employing duty cycle correction. Similarly to the first embodiment discussed with reference to FIG. 3(a), an N-stage period-matched DLL (with N being divisible by 4) is used to provide (N−1) outputs TAP[N−1], where each delay stage 30 provides one TAP[i] output. In this alternate embodiment however, the N/4−1 TOG cells have 4 inputs per cell instead of just 2. Specifically, the outputs of all N delay stages are connected to N/4 TOG cells. The 0 degree, 90 degree, 180 degree, and 270 degree inputs to each TOG cell are connected to the output of delay elements consecutively separated by N/4 stages. For example, TOG cell 0 receives TAP[0] at its 0 degree input, TAP[N/4] at its 90 degree input, TAP[2N/4] at its 180 degree input and TAP[3N/4] at its 270 degree input. Together, all the true (T) and complimentary (C) outputs of the N/4 TOG cells 31, 32, . . . 33 PHI[0] . . . PHI[N/2−1] represent N/2 distinct phases spaced 720/N degrees apart of a generated clock signal whose frequency is twice that of the reference input clock.

FIG. 4(b) illustrates a 4-input TOG cell comprising an SR flip-flop with 2 set signals S1 and S2, 2 reset signals R1 and R2, and 2 complimentary outputs T and C that are set on the rising edge of the 0 degree (S1) and 180 degree (S2) inputs and reset on the rising edge of the 90 (R1) degree and 270 degree (R2) inputs.

Figure 4C:
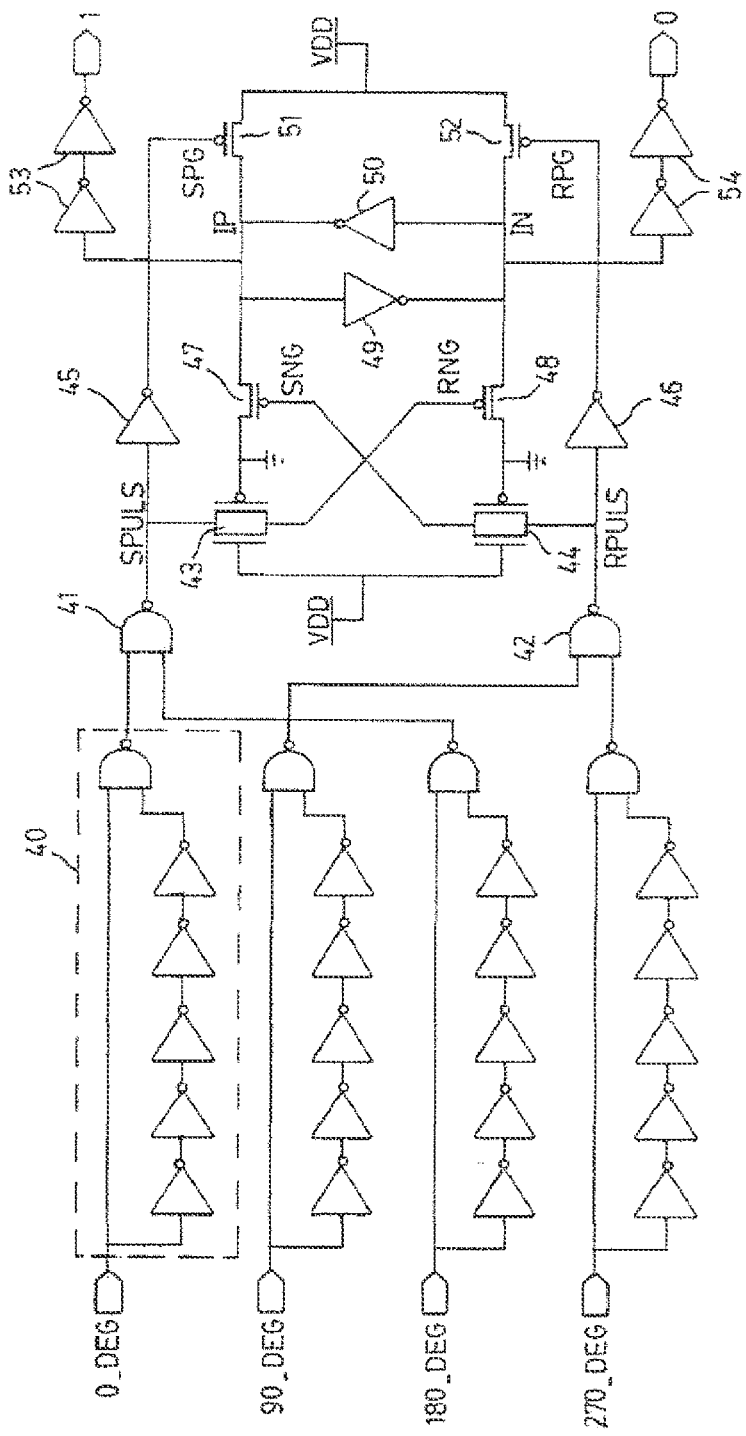
FIG. 4(c) is a detailed diagram of the 4-input cell illustrated in FIG. 4(b)

FIG. 4(c) is a detailed circuit implementation of one of the TOG cells used in the embodiment of FIG. 4(a). The TOG cell receives the 0_deg, 90_deg, 180_deg and 270_deg inputs into set/reset NAND gates 41 and 42 via rising edge pulse generators 40. The outputs of NAND gates 41 and 42 are coupled to SPULS and RPULS inputs of pass gates 43 and 44 respectively as well as to inverters 45 and 46 respectively. Pass gates 43 and 44 are hard-wired enabled with their NMOS gates connected to VDD and their PMOS gates connected to VSS. The outputs of pass gates 43 and 44, RNG and SNG respectively, are connected to gates of NMOS transistors 47 and 48, which are connected source-to-drain between VSS and nodes IN and IP respectively. These two nodes IN and IP are latched by two cross-coupled inverters 49 and 50, and also are coupled to the outputs T and C via inverters 53 and 54 respectively. Also coupled to nodes IN and IP are pull-up PMOS transistors 51 and 52 which are connected source to-drain between VDD and nodes IN and IP, and have their gates supplied by the outputs of NAND gates 41 and 42 respectively via inverters 45 and 46.

The purpose of transmission gate 43 is to add delay to compensate for the delay of the inverter 45 to more closely match transitions on the RNG and SPG lines. Similarly, the purpose of 44 is to add delay to compensate for the delay of the inverter 46 to more closely match transitions of SNG and RPG.

Figure 5:
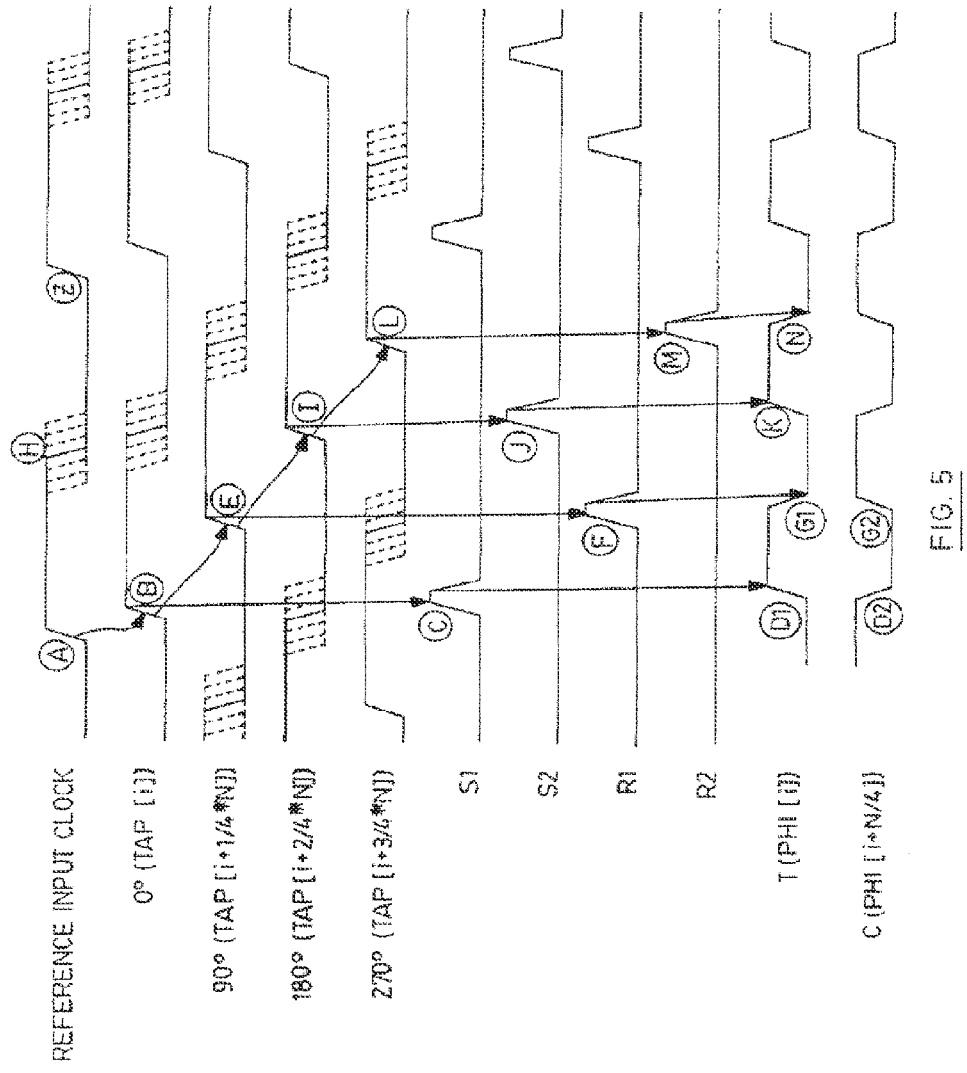
FIG. 5 is a timing diagram illustrating the operation of the embodiment of FIG. 4(a)

The operation of a 4-input TOG cell will now be described with reference to FIG. 4(c) as well as FIG. 5 which illustrates the timing of the generated signals. Prior to the internal clock generating sequence beginning, all inputs to NAND gates 41 and 42 are logic high, since at least one of the inputs of the NAND gates within the rising edge detectors are logic low. In response to a rising edge A of the reference clock signal, the 0 degree TAP[1] signal experiences a rising edge B, which is input into the rising edge pulse generator 40 which in turn generates a logic low output for inputting into NAND gate 41. This logic low output into NAND gate 41 causes a logic high signal to be output out of NAND gate 41, representing the S1 set pulse signal C in FIG. 5. The S1 pulse output from NAND gate 41 is passed through pass gate 43 and turns on NMOS 48, which in turn pulls node IN to VSS. Through the latching action of cross-coupled inverters 49 and 50, a logic high and logic low on nodes IP and IN, respectively is coupled to the outputs T and C via inverters 53 and 54 indicated as rising edge D1 and falling edge D2 in FIG. 5.

After a delay through stages i through N/4+i, the 90 degree tap output TAP[N/4+i] experiences a rising edge E in response to the rising edge B. Rising edge E is input as the 90-deg input of rising edge pulse generator 40 which subsequently generates a logic low output provided to NAND gate 42 which then generates the teset pulse R1 with rising edge F in FIG. 5. Similarly to the S1 path, the R1 pulse output of NAND gate 42 is passed through pass gate 44 to the gate of 47, pulling node IP to VSS. Through the latching action of cross-coupled inverters 49 and 50, the outputs T and C are brought to logic low and high respectively via inverters 53 and 54, illustrated in FIG. 5 as the falling edge G1 and rising edge G2 respectively. Note that thus far, the generation of the T and C outputs is very similar to the scheme described in FIG. 3, i.e. the sequence A-B-C-D1/D2 and A-B-E-F-G1/G2 are still independent once rising edge A has occurred. The difference between the first embodiment shown in FIG. 2(a) and FIG. 3 and the second embodiment shown in FIG. 4(a) and FIG. 5 lies in the generation of the second half of the period of the output clock signals T and C. Unlike in FIG. 3 where the second half of the period of outputs T and C was initiated by the falling edge of the reference input clock, edge H, which then propagated the sequence I-J-K and L-M-N, in this second embodiment illustrated in FIG. 5, the falling edge of the reference clock, edge H has no bearing on the generation of the sequences I-J-K and L-M-N. This is because the sequence I-J-K is initiated in response to rising edge E after a fixed internal delay, i.e. the 180 degree tap output is generated in response to the 90 degree tap output. Similarly, the sequence L-M-N is generated in response to the rising edge I which is generated in response to rising edge E as described above. As a result, the entire sequence A-B-C-D and A-B-E-F-G and A-B-E-I-J-K and A-B-E-I-L-M-N or more generally, A-N is independent of when the falling edge H of the reference input clock occurs. Therefore, the duty cycle of the reference input clock does not have to be 50% in order to obtain a 50% duty cycle output on the T and C outputs of the TOG cells. This second embodiment is therefore duty cycle corrected because any variation in the duty cycle of the input clock does not affect the pulse spacing or duty cycle of the frequency doubled output clock.

For both of the described embodiments of the invention, the propagation delay characteristics of the TOG cell are critical to the quality of the frequency doubled output clock waveform. It is important that the delay between an active edge entering a TOG cell input and the setting or resetting of the internal SR flip-slop be as close as possible for the two or four inputs. It is also important that the true and complimentary outputs of the TOG cell have as similar timing and switching characteristics as possible. The implementation illustrated in FIG. 4(c) possesses all these desired timing related properties.

Figure 6:
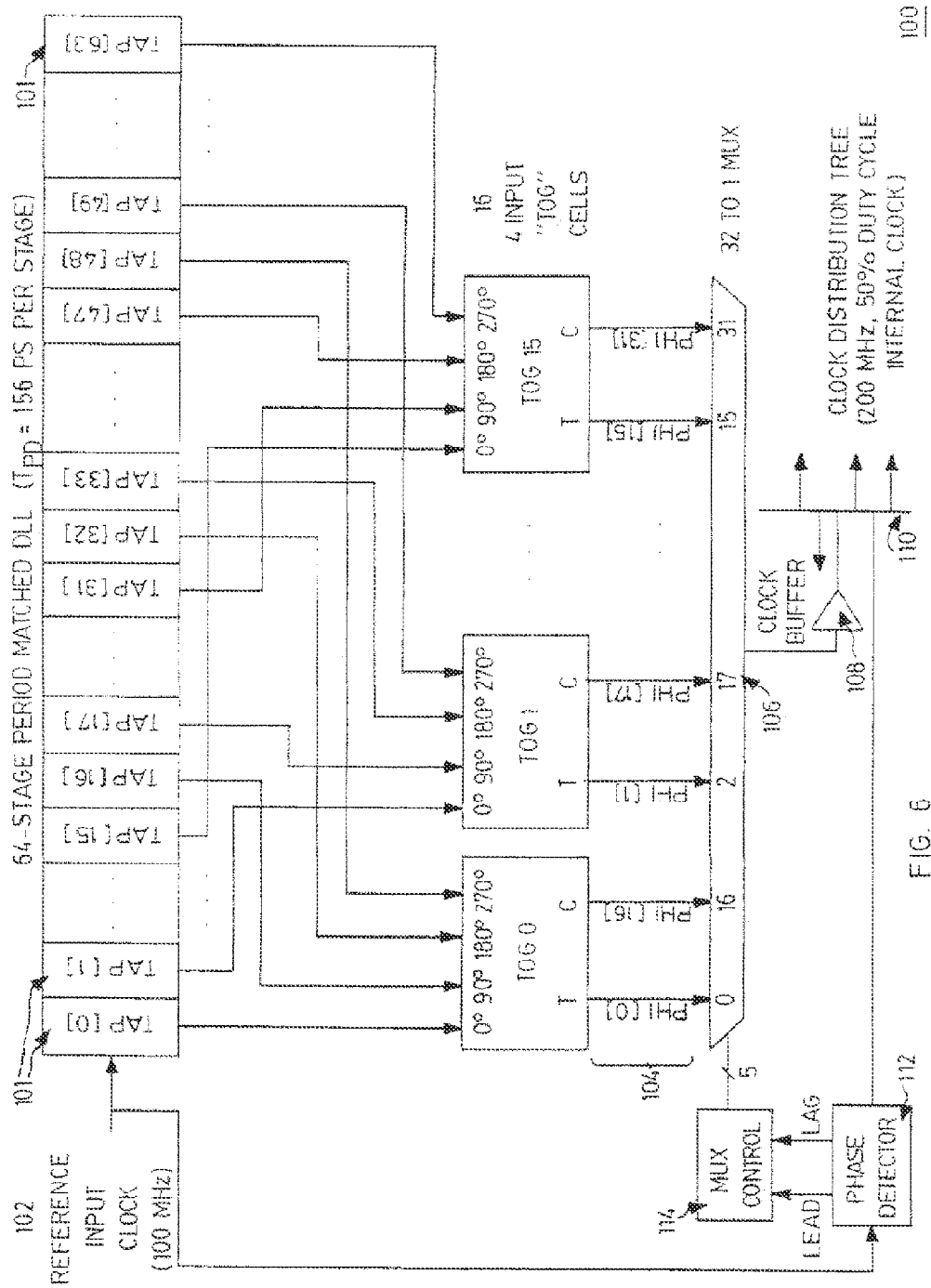
FIG. 6 is a block diagram of the overall DLL-based clock generating scheme employing the second embodiment of the invention illustrated in FIG. 4(a).

For applications where the phase relationship between the reference input clock and the frequency doubled internal clock is important, the N/2 output clock phases from the frequency doubling DLL can be fed to the inputs of a N/2 to 1 multiplexer. By adding a phase detector and MUX control logic, it is possible to chose the most appropriate clock phase from the N/2 clock phase outputs. A full clock generating scheme comprising the second embodiment of the frequency doubling DLL with duty cycle correction invention for use in a memory interface ASIC is represented generally in FIG. 6 by the numeral 100 having a plurality of serial delay elements 101. In this implementation, N=64 stages and the input reference clock 102 is nominally 100 MHz (Tcp=10.0 ns). It can be seen that the resolution depends on the number of delay elements 101. The DLL generates 32 phases 104 of a 50% duty cycle 200 MHz clock with each phase output spaced 720/64 or 11.25 degrees apart. A 32-input multiplexer 106 selects 1-of-32 phases to drive the clock buffer 108 and distribution tree 110 within the ASIC. The distributed clock 110 is fed back to phase detector 112 where its phase is compared to the 100 MHz reference input clock 102. A MUX control block 114 uses the output of the phase detector 112 to control the 32-1 multiplexer 106 to choose the PHI [i] input which as closely as possible lines up rising edges of the input reference clock 102 to every second rising edge of the distributed clock 110.

It should be noted that it is possible to extend the invention to generate internal clocks whose frequency is a larger multiple of the input reference clock frequency than two. A clock tripling DLL with duty cycle correction can be obtained by adding two more inputs to the four input TOG cell shown in FIG. 4(c) and connecting the six inputs to DLL delay elements outputs N/6 stages apart. Thus, the tap inputs will be offset by 0 degrees, 60 degrees, 120 degrees, 180 degrees, 240 degrees, and 300 degrees. Similarly, the scheme can be extended to a clock quadrupling DLL with duty cycle correction using eight input TOG cells and connections to DLL delay elements N/8 stages apart, i.e., the inputs are 45 degrees apart. Clock multiplication by a factor higher than four may also be practical given careful design of even higher fan-in TOG cells.

Other Applications

The Frequency Doubling DLL may be used in many of the types of applications that currently employ PLLs. These include data communications interface circuitry, memory system interface circuitry, microprocessor on-chip clock generation, and computer system chipset clock generation.

In addition, since many possible embodiments of the invention require substantially less analog and mixed signal circuitry than phase locked loops, it is better suited for highly integrated "system-on-a-chip" applications that require advanced low voltage, short gate length semiconductor processes for realization.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protections sought is to be defined by the claims appended hereto.

What is claimed is:

1. An integrated circuit comprising:
   a delay line including a plurality of delay stages,
   the delay line configured to receive a reference clock signal, and
   the plurality of delay stages configured to provide respective delay stage output signals;
   a detector circuit in communication with the delay line and configured to detect a first edge, a second edge, a third edge, and a fourth edge of respective first, second, third, and fourth ones of the delay stage output signals; and
   an output logic circuit in communication with the detector circuit, configured to provide an output signal, and further configured to:
   set the output signal when the detector circuit detects the first edge;
   reset the output signal when the detector circuit detects the second edge;
   set the output signal when the detector circuit detects the third edge; and
   reset the output signal when the detector circuit detects the fourth edge.

2. The integrated circuit as claimed in claim 1 wherein the plurality of delay stages total an amount that is divisible by four.

3. The integrated circuit as claimed in claim 2 wherein:
   the second edge is offset 90° from the first edge,
   the third edge is offset 180° from the first edge, and
   the fourth edge is offset 270° from the first edge.

4. The integrated circuit as claimed in claim 3 wherein a duty cycle of the output signal is substantially equal to 50%.

5. The integrated circuit as claimed in claim 1 wherein the detector circuit is further configured to:
   detect a fifth edge and a sixth edge of respective fifth and sixth ones of the delay stage output signals;
   set the output signal when the detector circuit detects the fifth edge; and
   reset the output signal when the detector circuit detects the sixth edge.

6. The integrated circuit as claimed in claim 5 wherein the plurality of delay stages total an amount that is divisible by six.

7. The integrated circuit as claimed in claim 6 wherein:
   the second edge is offset 60° from the first edge,
   the third edge is offset 120° from the first edge,
   the fourth edge is offset 180° from the first edge,
   the fifth edge is offset 240° from the first edge, and
   the sixth edge is offset 300° from the first edge.

8. The integrated circuit as claimed in claim 5 wherein the detector circuit is further configured to:
   detect a seventh edge and an eighth edge of respective seventh and eighth ones of the delay stage output signals;
   set the output signal when the detector circuit detects the seventh edge; and
   reset the output signal when the detector circuit detects the eighth edge.

9. The integrated circuit as claimed in claim 8 wherein the plurality of delay stages total an amount that is divisible by eight.

10. The integrated circuit as claimed in claim 9 wherein:
    the second edge is offset 45° from the first edge,
    the third edge is offset 90° from the first edge,
    the fourth edge is offset 135° from the first edge,
    the fifth edge is offset 180° from the first edge,
    the sixth edge is offset 225° from the first edge,
    the seventh edge is offset 270° from the first edge, and
    the eighth edge is offset 315° from the first edge.

11. The integrated circuit as claimed in claim 10 wherein a duty cycle of the output signal is substantially equal to 50%.

12. An integrated circuit comprising:
    a delay line including a plurality of delay stages,
    the delay line configured to receive a reference clock signal, and
    the plurality of delay stages configured to provide respective delay stage output signals;
    a detector circuit in communication with the delay line and configured to detect:
    a first edge and a second edge of a first one of the delay stage output signals provided by the plurality of delay stages, and
    a first edge and a second edge of a second one of the delay stage output signals provided by the plurality of delay stages; and
    an output logic circuit in communication with the detector circuit, configured to provide an output signal, and further configured to:
    set the output signal when the detector circuit detects the first edge of the first one of the delay stage output signals,
    reset the output signal when the detector circuit detects the first edge of the second one of the delay stage output signals,
    set the output signal when the detector circuit detects the second edge of the first one of the delay stage output signals, and
    reset the output signal when the detector circuit detects the second edge of the second one of the delay stage output signals.

13. The integrated circuit as claimed in claim 12 wherein the plurality of delay stages totals an amount that is divisible by four.

14. The integrated circuit as claimed in claim 13 wherein:
    the first edge of the second one of the delay stage output signals is offset 90° from the first edge of the first one of the delay stage output signals,
    the second edge of the first one of the delay stage output signals is offset 180° from the first edge of the first one of the delay stage output signals, and
    the second edge of the second one of the delay stage output signals is offset 270° from the first edge of the first one of the delay stage output signals.

15. The integrated circuit as claimed in claim 14 wherein a duty cycle of the output signal is substantially equal to 50%.

* * * * *